United States Patent
Haas, Jr. et al.

[11] Patent Number: 5,536,906
[45] Date of Patent: Jul. 16, 1996

[54] PACKAGE FOR INTEGRATED CIRCUITS

[75] Inventors: Glen R. Haas, Jr., Plano; John E. Barnett, Jr., Mesquite; Stephen R. Nelson, Richardson; Douglas J. Darrow; Susan V. Bagen, both of Dallas, all of Tex.; Henry Breit, Attleboro, Mass.; James Forster, Barrington, R.I.

[73] Assignee: Texas Instruments Incorporated, Dallas, Tex.

[21] Appl. No.: 97,336

[22] Filed: Jul. 23, 1993

[51] Int. Cl.$^6$ .................................................. H01L 23/02
[52] U.S. Cl. ........................ 174/52.4; 257/728; 257/787
[58] Field of Search .................................. 174/52.3, 52.4, 174/52.2; 257/703, 705, 728, 735, 763, 787, 788; 361/723, 813, 820; 333/33

[56] References Cited

U.S. PATENT DOCUMENTS

| | | | |
|---|---|---|---|
| 3,682,241 | 8/1972 | Duncan | 317/234 |
| 4,551,747 | 11/1985 | Gilbert et al. | 361/414 X |
| 5,294,751 | 3/1994 | Kamada | 174/52.4 |
| 5,294,897 | 3/1994 | Notani et al. | 29/832 X |
| 5,304,843 | 4/1994 | Takubo et al. | 257/670 |
| 5,355,102 | 10/1994 | Kornrumpf et al. | 333/33 |
| 5,362,680 | 11/1994 | Heiden et al. | 437/209 |
| 5,376,909 | 12/1994 | Nelson et al. | 333/247 |
| 5,418,329 | 5/1995 | Katoh et al. | 174/52.3 |

OTHER PUBLICATIONS

D. Darrow and S. Vilmer–Bagen, "A Comparative Analysis of Thin Film Metallization Methodologies for High Density Multilayer Hybrids", International Conference on Multi-Chip Modules, pp. 1–15, Apr. 1, 1992.

D. Darrow and S. Vilmer–Bagen, "Low–cost Patterned Metallization Technique for High Density Multilayer Interconnect Applications", Electronic Components and Technology Conference, pp. 544–549, Jun. 3, 1993.

M. Jadhav, S. Phadke, S. Gangal, and R. Karekar, "Electrical and Mechanical Properties of Ion–plated Copper Metallization on Dielectric Substrates", IEEE Trans. on Components, Hybrids and Manufacturing Technology, vol. 11, No. 2, Jun. 1988.

Primary Examiner—Kristine L. Kincaid
Assistant Examiner—Christopher Horgan
Attorney, Agent, or Firm—Michael K. Skrehot; James C. Kesterson; Richard L. Donaldson

[57] ABSTRACT

In one form of the invention, a package for integrated circuits and devices (42), (46) is disclosed, the package including: a package base (44), the base having a first top surface; a layer of material (43) on the first top surface of the base (44) wherein the material (43) is patterned to cover a portion of the base, and wherein the layer of material (43) forms a substrate having a second top surface; a microstrip transmission line (45) on the second top surface; and a plastic encapsulant (50), wherein the encapsulant covers the first top surface of the base.

8 Claims, 3 Drawing Sheets

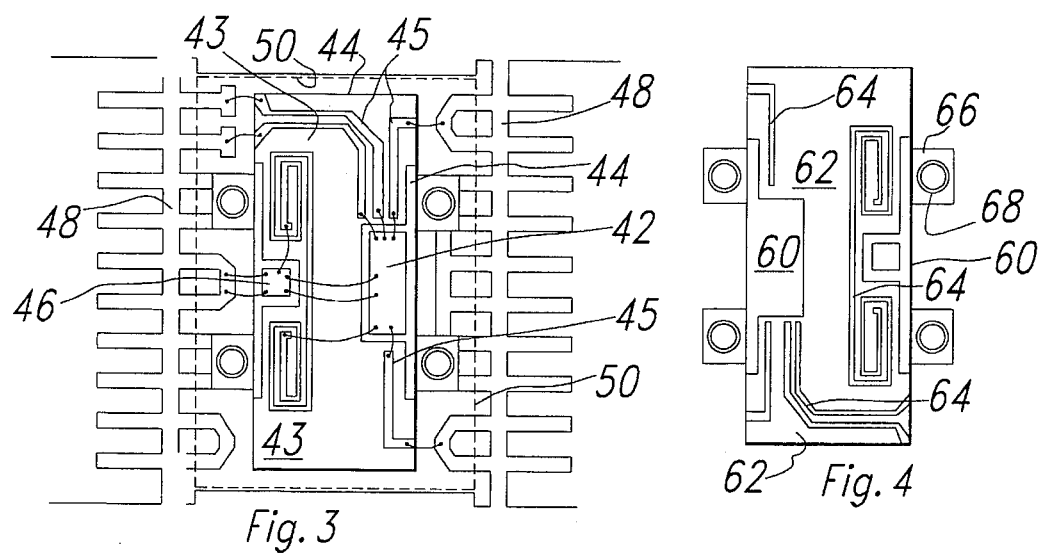
Fig. 3
Fig. 4
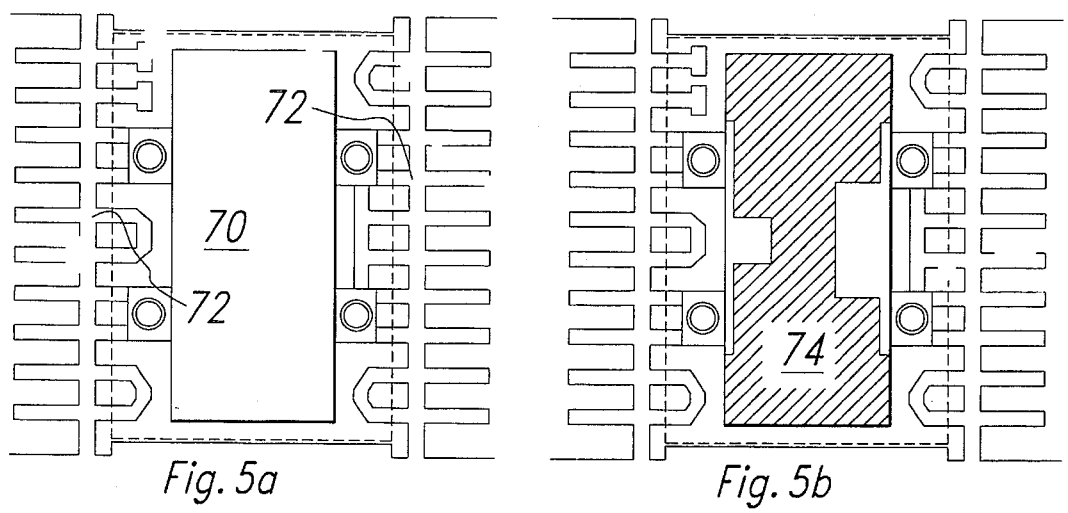
Fig. 5a
Fig. 5b
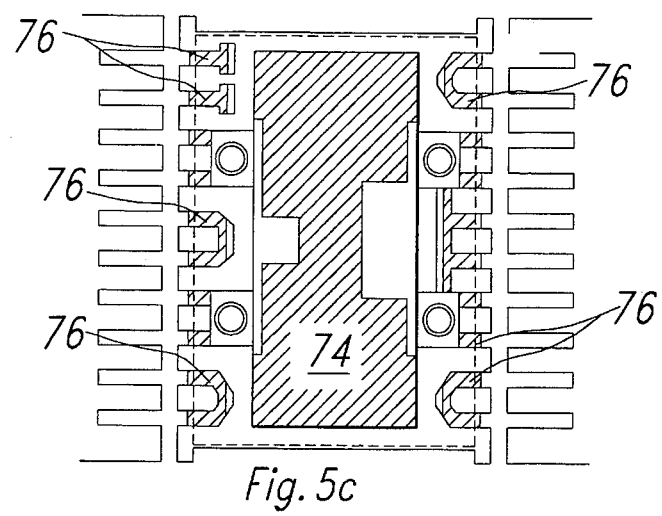
Fig. 5c

PACKAGE FOR INTEGRATED CIRCUITS

FIELD OF THE INVENTION

This invention generally relates to packaging for integrated circuits, and more particularly to packaging for high-frequency or microwave integrated circuits.

BACKGROUND OF THE INVENTION

Heretofore in this field, packaging for radio frequency (rf) or microwave devices and integrated circuits has suffered from relatively high cost and a general lack of suitability for high volume production processes. The style of packaging schemes used in the past was largely driven by the fact that electromagnetic interactions between the integrated circuit and the packaging become very important at high frequencies. For example, the leads that carry signals into the package are typically designed to possess a particular characteristic impedance. This impedance, in turn, is typically matched to the impedance of the integrated circuit. Creating leads that have a particular characteristic impedance is a complex process, as the proximity of other leads and the packaging material itself may influence the way signals are transmitted at high frequencies. Heretofore, designers have routed signal and control lines to high-frequency devices and integrated circuits within a package on thin or thick film networks (TFNs) which typically are comprised of a ceramic or dielectric substrate having metallized lines deposited on the top surface. At high frequencies, the dielectric constant and thickness of the substrate and the width and thickness of the lines are important in minimizing signal loss and signal reflection at the line-to-device connection.

SUMMARY OF THE INVENTION

Packaging for high-frequency integrated circuits in the past has suffered from process variability, low yield, and high cost due in large part to the need for the use of prefabricated TFNs to form transmission lines linking external package leads to the device being packaged. These pre-fabricated TFNs are typically comprised of a ceramic such as alumina ($Al_2O_3$) and are susceptible to cracking when cut into a particular pattern. TFNs are typically applied to the package base by solder or epoxy, and therefore contribute to a time-consuming and costly method of packaging semiconductor die. The invention described herein is addressed to solving these problems.

In one form of the invention, a package for integrated circuits and devices is disclosed, the package comprising: a package base, the base having a first top surface; a layer of material on the first top surface of the base wherein the material is patterned to cover a portion of the base, and wherein the layer of material forms a substrate having a second top surface; a microstrip transmission line on the second top surface; and a plastic encapsulant, wherein the encapsulant covers the first top surface of the base.

In another form of the invention, a method of packaging integrated circuits and devices is disclosed, the method comprising the steps of: forming a layer of material on a first top surface of a base, wherein the layer of material forms a substrate having a second top surface; forming metallization on the second top surface, wherein the metallization is patterned to form microstrip transmission lines; and encapsulating the first top surface of the base in plastic.

In still another form of the invention, a method of packaging integrated circuits and devices is disclosed, the method comprising the steps of: depositing a patterned layer of ceramic on a first top surface of a base with a thermal deposition technique, wherein the layer of ceramic forms a substrate having a second top surface; depositing a layer of photoresist on the second top surface; patterning the photoresist to leave exposed regions of the second top surface; depositing metallization on the regions of the second top surface with an ion plating technique to form microstrip transmission lines; and encapsulating the first top surface of the base in plastic.

An advantage of the invention is that it provides an efficient and cost effective way of providing substrate material and transmission lines for low-cost high-frequency device packaging. By directly depositing a patterned substrate material onto a package base and in turn depositing metallization to form transmission lines on this substrate, the expense and yield impact of handling a discrete TFN part is greatly minimized. In addition, the invention allows components such as capacitors and inductive transmission lines to be placed on the substrate material rather than on the semiconductor device substrate. This typically results in a smaller (and therefore, less costly) semiconductor die.

BRIEF DESCRIPTION OF THE DRAWINGS

In the drawings:

FIG. 3 is a plan view of a preferred embodiment package layout;

FIG. 4 is a plan view of a preferred embodiment package base at an intermediate stage of completion;

FIGS. 5a to 5e are plan views of a preferred embodiment packaging process at various stages of completion.

Corresponding numerals and symbols in the different figures refer to corresponding parts unless otherwise indicated.

DETAILED DESCRIPTION OF PREFERRED EMBODIMENTS

Figure 1:
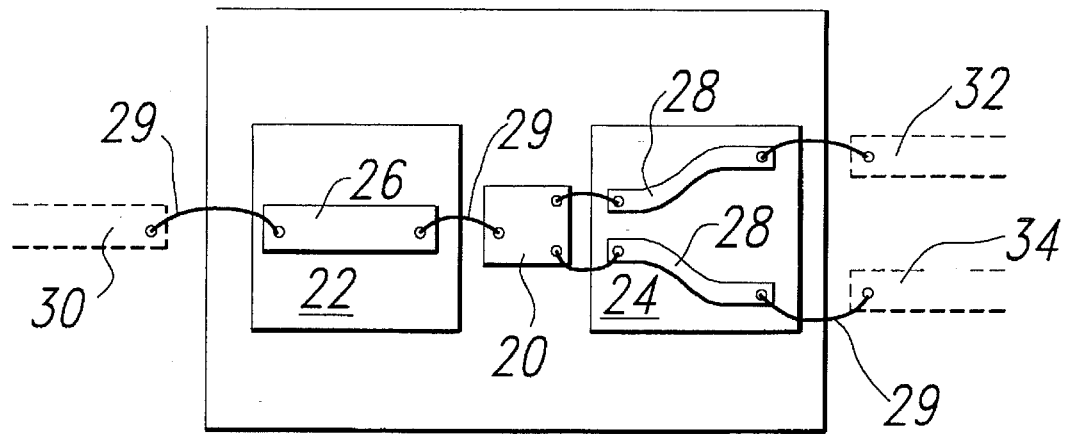
FIG. 1 is a plan view of a typical prior art high-frequency connection scheme.

Because semiconductor die in general, and GaAs die in particular, are relatively thin and brittle, making connections to these die in the past has been difficult. In high-frequency applications, this problem of making connections to semiconductor die is complicated by the need for a matched condition between the characteristic impedance of the transmission lines leading into the die and the device or circuit on the die to which they are connected. Therefore, the substrate on which the transmission lines are disposed, and the lines themselves, are designed in order to create a particular characteristic impedance. For example, as shown in FIG. 1, in the past a common technique for routing signals from an external lead 30, 32, 34, into the semiconductor die 20, has been to use thin film networks (TFNs) 22, 24 typically comprising a substrate material such as alumina ($Al_2O_3$) and having Au-plated microstrip lines 26, 28 deposited on the substrate surface. In the arrangement depicted in FIG. 1, a single microstrip line 26 serves as a conduction path between the external lead 30 and the semiconductor die 20. Output signals from the die 20 in this example may be transmitted along microstrip lines 28 to external leads 32 or 34. Connections between leads, microstrip lines, and die are typically made using approximately 25 μm diameter Au wires 29 attached by a standard ball bonding technique.

High-frequency semiconductor devices and integrated circuits have traditionally been packaged in metal or ceramic cavities designed to present minimal interference between the package and the electromagnetic fields surrounding the transmission lines that carry high-frequency signals. This type of packaging requires complex fabrication processes and as a result is not economically viable for large volume semiconductor products. Plastic packaging for high frequency applications is not widely used and has only recently been considered for the packaging of rf and microwave devices. In coassigned patent application Ser. No. 07/967, 483 a packaging scheme is described in which a microwave integrated circuit is encapsulated in plastic. The method for routing signals, both DC and RF to the integrated circuit is to use a TFN similar to that described in FIG. 1.

Figure 2A:
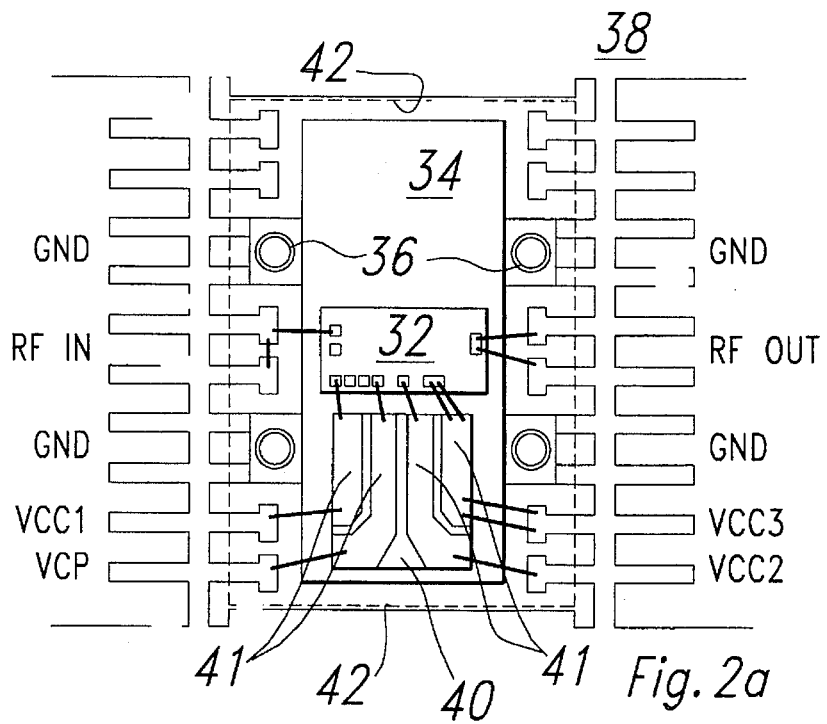
FIGS. 2a and 2b are plan and side views of a typical package layout.
Figure 2B:
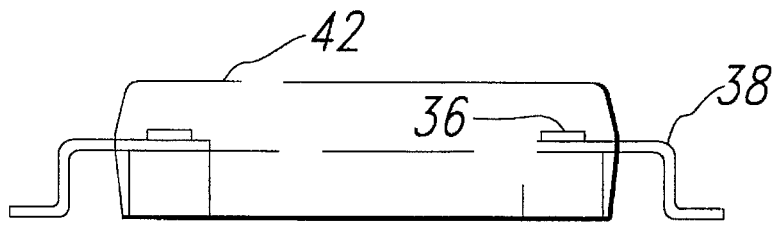

FIGS. 2a and 2b show a plan and side view of a packaging technique for a high-frequency integrated circuit 32 in a small outline (SO) plastic package. The integrated circuit 32 is mounted on a metal package base 34 which in turn is attached by rivets 36 onto a leadframe 38. The portion of the assembly indicated by dashed line 42 in FIG. 2a is encapsulated in plastic by standard techniques. In addition to the integrated circuit 32, a TFN 40 is mounted on the base 34 as well. The TFN facilitates routing of dc or rf signals from leads on the leadframe to the integrated circuit itself. In the example structure of FIG. 2a, rf does not transit the TFN in order to reach the integrated circuit, but it may be appreciated that microstrip lines may be routed on the TFN 40, as are DC lines 41. For rf signals to be transmitted across the TFN, the line widths and substrate height are key parameters in setting the characteristic impedance of the transmission line. In this embodiment, the TFN is a discrete part that is epoxied, soldered or otherwise mounted onto the base 34, as is the integrated circuit 32. This need for mounting the additional part 40 leads to process variability which stems from the need for multiple alignments for placement of the TFN and integrated circuit. The elimination of the need for aligning and mounting the TFN might greatly reduce product cost and cycle time.

A preferred embodiment of an inventive packaging concept is shown in FIG. 3. In FIG. 3, the integrated circuit 42 is mounted on a base 44 along with a capacitor 46. The base 44, in turn, is riveted on a leadframe 48. Leadframe 48 is typically a metal such as Cu, Ni, Silvar (an alloy of Ag and Invar), CuW/CuMo (powder or laminate), Alloy 42, or other common leadframe materials, and may be plated with Pd or Ag, or the leadframe may be constructed entirely of Pd. The surface of the base 44 and a large portion of the leadframe 48 are encapsulated in plastic, the outline of which is denoted by dashed line 50 (the backside of the base may be left uncovered by plastic for enhanced thermal conductivity, or it may be fully encapsulated in plastic). The plastic encapsulant is typically Plascon 7060, for example, an opaque material which is black in color and has a relative permittivity, $\epsilon_r$, of approximately 4.5.

A prime difference between this embodiment and the arrangement described in FIG. 2a is that there is no discrete TFN part 40. Rather, the ceramic (e.g. alumina) substrate 43 of the TFN has been deposited directly onto the base 44 along with integrated circuit 42. The intimate contact between integrated circuit 42 and substrate 43 on base 44 provides thermal advantages over prior art techniques in which an integrated circuit is mounted on the leadframe or on alumina, or in which it is necessary to epoxy or solder the substrate to the base. Heat may be removed from the integrated circuit 42 through base 44 more efficiently in the inventive embodiment than in the abovementioned prior art arrangements.

The substrate 43 is deposited by a thermal deposition technique, such as the flame plasma deposition process. This deposition process, for example plasma arc deposition and plasma spray, is a well known thermal spray coating process, and is well suited for the deposition of ceramics. In the flame plasma deposition process, a plasma-forming gas (e.g. Ar or N) is used both as a heat source and a propelling agent for the coating material. The gas is ionized by a high-voltage arc struck between an anode and a cathode of a spray gun and is then forced through a nozzle. As the gas leaves the nozzle, it reverts to its natural state and liberates a large amount of heat. The coating material, such as alumina, is provided in powdered form and is injected into the hot gas stream where it is melted and projected at high velocity onto the base 44. Adhesion between the ceramic 43 and base 44 may be enhanced by mechanical abrasion of the base or by a technique wherein a precoat layer of a cermet or other suitable material, such as flame-plasma-deposited nickel aluminide, is deposited. Thereafter, an overcoat layer of flame plasma deposited alumina can be applied to the precoated base to obtain the desired substrate coating. Because ceramics (i.e. alumina) in general are porous, they are subject to absorbing moisture. One way to address this problem is to apply an inorganic solution to the ceramic which penetrates the pores. The structure could then be fired at a temperature of approximately 500° C. to convert the solute to a ceramic. A typical inorganic solution could comprise $SiO_2$. Other possible sealants include a spin-on glass, polyimide, or and alumina slurry.

An alternative to plasma deposited material for the substrate is a laminate dielectric. A wide variety of laminate dielectrics are used in printed circuit boards and in similar applications. A typical laminate comprises a Teflon matrix embedded with polyimide, or a similar material. Reinforced plastic (FR4 for example) and cyanate ester are examples of other laminate dielectrics. The laminate may be applied to the base using an autoclave or laminator for example. The advantage of a laminate is that it may be patterned by a commonly used technique such as laser ablation or reactive ion etching.

The microstrip lines 45, which may be composed of Cu, Au, Al, or Pd for example, are deposited with an Enhanced Ion Plating (EIP) or other suitable metallization technique. Ion-plating processes are vacuum deposition processes, usually with thermal evaporation sources, that involve high energy particle bombardment of a substrate. Conventional ion-plating systems usually involve a direct current (DC) bias potential (−2 to −5 kV) or a radio frequency (RF) bias with an inert gas (typically Ar) at a pressure of 5 to 200 mtorr. The EIP process uses an RF bias and, in some cases, a magnetic field as sources of ionization, with an applied negative DC bias. The metal vapor itself is ionized without the use of the Ar plasma, although Ar is occasionally used for increased ion bombardment, but at a low pressure (roughly $1\times10^{-4}$ torr). The substrate is biased and thus becomes the cathode of a low pressure electric discharge (commonly called a glow discharge), which results in a plasma or ion-assisted deposition. When ionized, the vapor particles are accelerated toward the substrate, striking with energies that range from thermal (less than 1 eV) to hundreds of electron volts. The benefit of using an ion-plating process like EIP is the increased adhesion obtained from the high arrival energy of the ionized evaporants. Adhesion is enhanced by an increase in the density of nucleation sites that in turn reduces voiding, which occurs in the initial stages of normal film growth. The EIP process is done at the system base pressure to minimize substrate heating and gas entrapment. The substrate bias is RF and DC in the presence of a magnetic field. The theory of the effect is to provide a higher level of ionization of the evaporant material and to accelerate the positive ions toward the substrate using an applied DC bias. An additional advantage of EIP is that it is a conformal deposition technique, i.e. it is not limited to line-of-sight deposition. EIP is capable of plating around corners and over edges that a line-of-sight method like evaporation would leave unplated.

Other metallization techniques, such as electroplating, sputtering, or evaporation may be used to form microstrip lines 45. Typically, Cu or Au are electroplated, while Al, which cannot easily be plated, is deposited by sputtering or evaporation. However, EIP has been shown to have advantages over the other techniques including lower temperature, lower film stress, more bulk-like properties (resistivity and grain size), superior adhesion, film thickness uniformity, and reduced process complexity and variability. Another advantage of EIP is that it produces conductors that offer line dimensions (width, tolerance) and shape control (rectangular cross-section) similar to that of conductors made with a thin-film plus electroplated process, but with much less cost.

The plasma deposition of the substrate and the use of EIP for surface metallization removes the need for a discrete TFN part, i.e. TFN 40 in FIG. 2a. It also removes the need for soldering or epoxying the TFN to the base 44. This technique lends itself to a process flow capable of generating production volume at relatively low costs. Standard Au ball bonding serves to connect the semiconductor die 42 to metallization 45 (i.e. microstrip transmission lines) and then the metallization 45 to the leads 52, which are an integral part of the leadframe 48.

A packaging process may generally occur as described hereinbelow. The base material may start as an approximately 12"×18" sheet of metal, 1.25 mm thick Ni-plated Cu, for example. The base material may also be Au, Al, or Pd for example. For high-power, high temperature devices or integrated circuits, a base metal of approximately 1.125 mm thick Cu with a cladding of 125 μm of Mo may be appropriate since the package base also serves an important role as the heatsink for the die 42. It has been shown that Mo and alumina possess comparable Temperature Coefficients of Expansion (TCE) and therefore may be better able to withstand high temperature operation or firing cycles without incurring delamination or cracking of the alumina substrate. Alignment and registration holes are established for precision stamping of bases. The ceramic may then be deposited in the desired pattern on this sheet of metal to a thickness of typically 0.25, 0.375, or 0.50 mm, but could be virtually any desired thickness. The ceramic may be patterned in a variety of ways. For example, portions of the base to be left uncovered by the ceramic substrate may be physically masked, with metal foil for example. After the plasma deposition of the ceramic, the metal foil is removed. An alternative patterning technique is ultrasonic machining. In this technique, the surface of the base is coated with ceramic. Ultrasonic machining is then used to remove ceramic from the portions of the base where integrated circuits or devices such as capacitors are to be mounted. This technique results in smoother pattern edges and is generally more controllable, but is more expensive than simply masking the base during deposition.

A typical thickness for the die 42 is approximately 100 um, hence it is much thinner than the substrate material. In certain situations, such as for high frequency or microwave circuits for example, it is advantageous to minimize the bond wire length between components (i.e. the substrate surface and the die surface). One way to address this need is to increase the elevation of the die by mounting it on a pedestal. A pedestal may be easily fabricated on the package base through coining or a similar process. However, a constraint on this pedestal is that it not interfere with the conduction of heat from the die to the base. This technique results in a more planar arrangement with the surfaces of the substrate and the die being approximately the same, therefore, the bond wires between the surfaces may be made shorter.

Package bases may then be stamped or cut out from this metal sheet and then mounted on a leadframe. FIG. 4 shows a package base 60 with a patterned alumina substrate 62. In this way the metal base 60 is integrated with the TFN substrate 62, thereby eliminating the TFN as a separate part. EIP may then be used to deposit microstrip lines 64 of Cu, for example, on the ceramic substrate 62. Lines may typically be as narrow as 25 μm and may be spaced as closely as approximately 25 μm, though it is expected that narrower lines with closer spacing may also be obtained. The lines are typically patterned and deposited using a liftoff process. Photoresists, metal foil, and polyimides are examples of masking materials typically used. The type of deposition process used will dictate the type of masking. A photoresist will be sensitive to process temperature, thus a low substrate temperature must be maintained during deposition (as in EIP). Vias may be formed in the substrate 62 (to facilitate grounding of capacitor bottom plates for example). Electrical contact may be made through the vias by plating with EIP or an electroless plating technique, for example.

The base 60 also includes tabs 66 and holes 68 for attachment to a leadframe. This scheme lessens the need for the handling of discrete TFNs and results in a more economical and less variable assembly. The 12"×18" sheet of metal yields approximately 720 bases or heatsinks per sheet (for typical SO package dimensions).

Figure 5D:
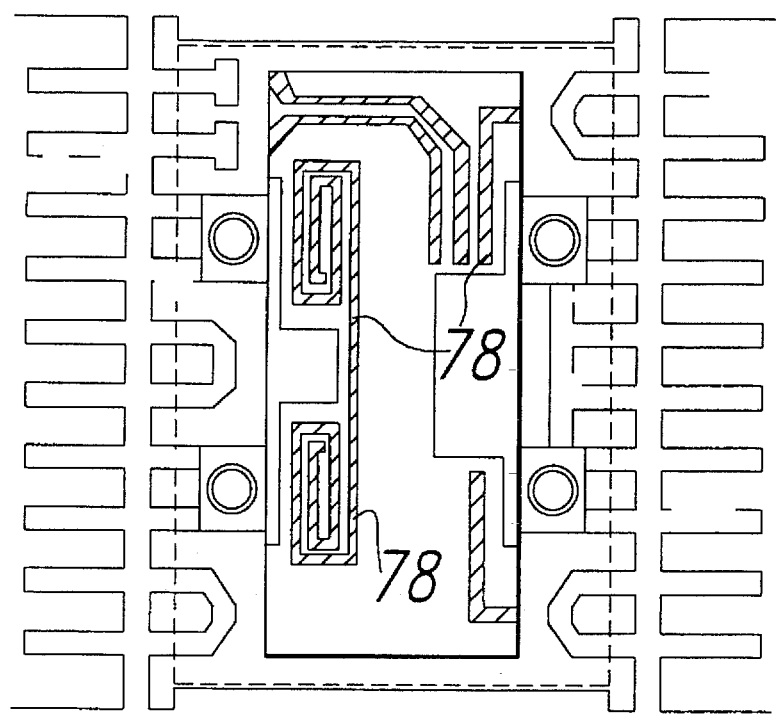
Figure 5E:
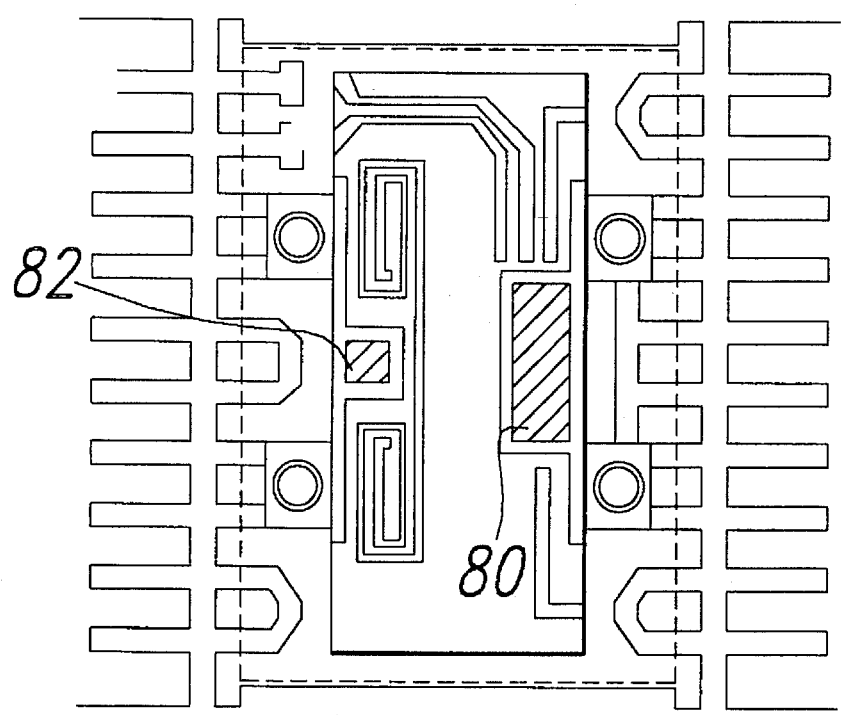

Another packaging scheme is shown in FIGS. 5a to 5e wherein a typical process flow may start with a base 70 mounted on a leadframe 72 in FIG. 5a; then a patterned substrate 74 is flame-plasma-deposited on the base as shown in FIG. 5b, or optionally, in addition to the substrate pattern, portions 76 of the leadframe may also be coated (FIG. 5c); metallization may then be deposited, through a process such as EIP, in the form of microstrip lines 78 shown in FIG. 5d; followed by the placement of components such as a semiconductor die 80 or capacitor 82 as shown in FIG. 5e; and ending with the ball bonding of wires and plastic encapsulation as shown in FIG. 3 hereinabove. It has been shown that the adhesion between a leadframe and the plastic encapsulant is enhanced by coating the leadframe with ceramic (i.e. alumina). This helps to create a moisture seal at the critical plastic-to-leadframe interface. It should be noted that adhesion is enhanced wherever ceramic is deposited, including over the base surface and on the backside of the base (when the entire base is to be encapsulated in plastic).

As in the scheme described above, EIP or another suitable metallization technique may be used to deposit microstrip lines 78, shown in FIG. 5d. Additionally, it may be desired to form capacitors on the substrate. One technique may be to deposit a metallized bottom plate in the manner in which the microstrip lines were deposited, then deposit a dielectric such as $Si_3N_4$ or $SiO_2$ (of approximately 2000 Å thickness) on the bottom plate. A capacitor top plate and airbridge to the substrate may then be formed with standard techniques. As an alternative, capacitors may be formed directly on the package base. A capacitor of this type would have the base itself as the bottom plate, a layer of dielectric on top of the base, and then a plated metal top plate as described above. This configuration is ideal for grounded capacitors, as the bottom plate of the capacitor is constructed of the ground plane (i.e. the base), thereby eliminating the need for bond wires between the bottom plate and the ground plane that may add undesired inductance. The patterned substrate may incorporate holes for forming vias from the substrate surface to the ground plane (i.e. the package base). Additionally, thin-film resistors may also be patterned on the substrate using TaN, NiCr, or other suitable material, for example.

An advantage of the packaging scheme described above is that TFNs may be patterned into virtually any shape without undue risk of the cracking or deterioration due to cutting or handling that has been a problem with prior art packaging schemes that incorporate TFNs. For example, a TFN in the shape of that shown in FIG. 3 might be impractical if it were required to be cut or scribed into the shape shown. The narrow portion of the substrate that extends between the semiconductor die 42 and the capacitor 46 would likely be susceptible to cracking and breaking. The direct deposition of the ceramic substrate onto the package base and the subsequent deposition of microstrip lines onto the substrate remove the need for cutting and placing a discrete TFN onto the package base. It may be appreciated that the technique allows for a great deal of flexibility in forming TFNs.

Another advantage of the technique is that ceramic may be deposited on a portion of the leadframe so that adhesion between the plastic package encapsulant and the leadframe is enhanced. This helps prevent moisture leakage into the package as well as the package delamination that can occur during thermal cycling.

A few preferred embodiments have been described in detail hereinabove. It is to be understood that the scope of the invention also comprehends embodiments different from those described, yet within the scope of the claims.

Internal and external connections can be ohmic, inductive, capacitive, direct or indirect, via intervening circuits 1 or otherwise. Implementation is contemplated in discrete components or fully integrated circuits in silicon, gallium arsenide, or other electronic materials families, as well as in optical-based or other technology-based forms and embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, although the substrate material mentioned hereinabove was alumina, it may be appreciated that AlN, $SiO_2$, glasses, porcelain, and combinations of plastics and ceramics, and other similar materials may also be appropriate. In addition, although the package described in the preferred embodiments was of the plastic-encapsulated type, it may be appreciated that the techniques described hereinabove may also find application in other packaging styles where there might be need for routing microstrip lines on a substrate material. It is therefore intended that the appended claims encompass any such modifications or embodiments.

What is claimed is:

1. A package for integrated circuits and devices comprising:
    a package base, said base having a first top surface;
    a layer of material on said first top surface of said base wherein said material is patterned to cover a portion of said base, and wherein said layer of material forms a substrate having a second top surface;
    a microstrip transmission line on said second top surface; and
    a plastic encapsulant, wherein said plastic encapsulant covers said first top surface of said base.

2. The package of claim 1 wherein said material is a ceramic.

3. The package of claim 2 wherein said ceramic is alumina ($Al_2O_3$).

4. The package of claim 1 further comprising a leadframe, wherein said base is attached to said leadframe, and said plastic encapsulant covers a portion of said leadframe.

5. The package of claim 4 wherein said layer of material is deposited on said portion of said leadframe covered by said plastic encapsulant, whereby adhesion between said plastic encapsulant and said leadframe is enhanced.

6. The package of claim 1 wherein said integrated circuits and devices are mounted on said base.

7. The package of claim 1 wherein said base comprises Cu.

8. The package of claim 1 wherein said base is clad with Mo.

\* \* \* \* \*